United States Patent
Shtrom

(10) Patent No.: US 7,696,946 B2
(45) Date of Patent: Apr. 13, 2010

(54) REDUCING STRAY CAPACITANCE IN ANTENNA ELEMENT SWITCHING

(75) Inventor: Victor Shtrom, Sunnyvale, CA (US)

(73) Assignee: Ruckus Wireless, Inc., Sunnyvale, CA (US)

( * ) Notice: Subject to any disclaimer, the term of this patent is extended or adjusted under 35 U.S.C. 154(b) by 88 days.

(21) Appl. No.: 11/799,458

(22) Filed: Apr. 30, 2007

(65) Prior Publication Data

US 2007/0247255 A1    Oct. 25, 2007

Related U.S. Application Data

(63) Continuation-in-part of application No. 11/010,076, filed on Dec. 9, 2004, now Pat. No. 7,292,198, and a continuation-in-part of application No. 11/041,145, filed on Jan. 21, 2005, now Pat. No. 7,362,280.

(60) Provisional application No. 60/602,711, filed on Aug. 18, 2004, provisional application No. 60/603,157, filed on Aug. 18, 2004, provisional application No. 60/795,919, filed on Apr. 28, 2006.

(51) Int. Cl.
*H01Q 21/00* (2006.01)

(52) U.S. Cl. .............................. 343/853; 343/700 MS; 343/876

(58) Field of Classification Search .......... 343/700 MS, 343/853, 876; 333/17.3
See application file for complete search history.

(56) References Cited

U.S. PATENT DOCUMENTS

| | | | |
|---|---|---|---|
| 723,188 A | 3/1903 | Tesla | |
| 725,605 A | 4/1903 | Tesla | |
| 1,869,659 A | 8/1932 | Broertjes | |
| 2,292,387 A | 8/1942 | Markey et al. | |
| 3,488,445 A | 1/1970 | Chang | |
| 3,568,105 A | 3/1971 | Felsenheld | |
| 3,967,067 A | 6/1976 | Potter | |
| 3,982,214 A | 9/1976 | Burns | |
| 3,991,273 A | 11/1976 | Mathes | |
| 4,001,734 A | 1/1977 | Burns | |

(Continued)

FOREIGN PATENT DOCUMENTS

EP        352787 A2     1/1990

(Continued)

OTHER PUBLICATIONS

"Authorization of Spread Spectrum Systems Under Parts 15 and 90 of the FCC Rules and Regulations," Rules and Regulations Federal Communications Commission, 47 CFR Part 2, 15, and 90, Jun. 18, 1985.

(Continued)

*Primary Examiner*—Tho G Phan
(74) *Attorney, Agent, or Firm*—Carr & Ferrell LLP.

(57) ABSTRACT

An antenna array may include an antenna element configured to receive an RF signal. A PIN diode may selectively couple the antenna element to an RF source. Biasing the PIN diode may cancel the received RF signal at a stub coupled to the diode thereby reducing stray capacitance of the PIN diode. A method for switching antenna elements is also disclosed. A PIN diode coupled to an antenna element is biased thereby reflecting the received RF signal out-of-phase within a stub such that the signal is canceling and stray capacitance of the PIN diode is reduced.

19 Claims, 3 Drawing Sheets

U.S. PATENT DOCUMENTS

| | | | |
|---|---|---|---|
| 4,176,356 | A | 11/1979 | Foster et al. |
| 4,193,077 | A | 3/1980 | Greenberg et al. |
| 4,253,193 | A | 2/1981 | Kennard |
| 4,305,052 | A | 12/1981 | Baril et al. |
| 4,513,412 | A | 4/1985 | Cox |
| 4,554,554 | A * | 11/1985 | Olesen et al. ............... 343/895 |
| 4,733,203 | A | 3/1988 | Ayasli |
| 4,814,777 | A | 3/1989 | Monser |
| 5,063,574 | A | 11/1991 | Moose |
| 5,097,484 | A | 3/1992 | Akaiwa |
| 5,173,711 | A | 12/1992 | Takeuchi et al. |
| 5,203,010 | A | 4/1993 | Felix |
| 5,208,564 | A | 5/1993 | Burns et al. |
| 5,220,340 | A | 6/1993 | Shafai |
| 5,282,222 | A | 1/1994 | Fattouche et al. |
| 5,291,289 | A | 3/1994 | Hulyalkar et al. |
| 5,311,550 | A | 5/1994 | Fouche et al. |
| 5,373,548 | A | 12/1994 | McCarthy |
| 5,507,035 | A | 4/1996 | Bantz |
| 5,532,708 | A | 7/1996 | Krenz et al. |
| 5,559,800 | A | 9/1996 | Mousseau et al. |
| 5,754,145 | A | 5/1998 | Evans |
| 5,767,755 | A | 6/1998 | Kim et al. |
| 5,767,809 | A | 6/1998 | Chuang et al. |
| 5,786,793 | A | 7/1998 | Maeda et al. |
| 5,802,312 | A | 9/1998 | Lazaridis et al. |
| 5,964,830 | A | 10/1999 | Durrett |
| 5,990,838 | A | 11/1999 | Burns et al. |
| 6,011,450 | A | 1/2000 | Miya |
| 6,031,503 | A | 2/2000 | Preiss, II et al. |
| 6,034,638 | A | 3/2000 | Thiel et al. |
| 6,052,093 | A | 4/2000 | Yao et al. |
| 6,091,364 | A | 7/2000 | Murakami et al. |
| 6,094,177 | A | 7/2000 | Yamamoto |
| 6,097,347 | A | 8/2000 | Duan et al. |
| 6,104,356 | A | 8/2000 | Hikuma et al. |
| 6,169,523 | B1 * | 1/2001 | Ploussios .................... 343/895 |
| 6,266,528 | B1 | 7/2001 | Farzaneh |
| 6,292,153 | B1 | 9/2001 | Aiello et al. |
| 6,307,524 | B1 | 10/2001 | Britain |
| 6,317,599 | B1 | 11/2001 | Rappaport et al. |
| 6,323,810 | B1 | 11/2001 | Poilasne et al. |
| 6,326,922 | B1 | 12/2001 | Hegendoerfer |
| 6,337,628 | B2 | 1/2002 | Campana, Jr. |
| 6,337,668 | B1 | 1/2002 | Ito et al. |
| 6,339,404 | B1 | 1/2002 | Johnson et al. |
| 6,345,043 | B1 | 2/2002 | Hsu |
| 6,356,242 | B1 | 3/2002 | Ploussios |
| 6,356,243 | B1 | 3/2002 | Schneider et al. |
| 6,356,905 | B1 | 3/2002 | Gershman et al. |
| 6,377,227 | B1 | 4/2002 | Zhu et al. |
| 6,392,610 | B1 | 5/2002 | Braun et al. |
| 6,404,386 | B1 | 6/2002 | Proctor, Jr. et al. |
| 6,407,719 | B1 | 6/2002 | Ohira et al. |
| RE37,802 | E | 7/2002 | Fattouche et al. |
| 6,414,647 | B1 | 7/2002 | Lee |
| 6,424,311 | B1 | 7/2002 | Tsai et al. |
| 6,442,507 | B1 | 8/2002 | Skidmore et al. |
| 6,445,688 | B1 | 9/2002 | Garces et al. |
| 6,456,242 | B1 | 9/2002 | Crawford |
| 6,493,679 | B1 | 12/2002 | Rappaport et al. |
| 6,496,083 | B1 | 12/2002 | Kushitani et al. |
| 6,498,589 | B1 | 12/2002 | Horii |
| 6,499,006 | B1 | 12/2002 | Rappaport et al. |
| 6,507,321 | B2 | 1/2003 | Oberschmidt et al. |
| 6,531,985 | B1 | 3/2003 | Jones et al. |
| 6,583,765 | B1 | 6/2003 | Schamberger et al. |
| 6,586,786 | B2 | 7/2003 | Kitazawa et al. |
| 6,611,230 | B2 | 8/2003 | Phelan |
| 6,625,454 | B1 | 9/2003 | Rappaport et al. |
| 6,633,206 | B1 | 10/2003 | Kato |
| 6,642,889 | B1 * | 11/2003 | McGrath ............. 343/700 MS |
| 6,674,459 | B2 | 1/2004 | Ben-Shachar et al. |
| 6,701,522 | B1 | 3/2004 | Rubin et al. |
| 6,724,346 | B2 | 4/2004 | Le Bolzer |
| 6,725,281 | B1 | 4/2004 | Zintel et al. |
| 6,741,219 | B2 | 5/2004 | Shor |
| 6,747,605 | B2 | 6/2004 | Lebaric |
| 6,753,814 | B2 | 6/2004 | Killen et al. |
| 6,762,723 | B2 | 7/2004 | Nallo et al. |
| 6,779,004 | B1 | 8/2004 | Zintel |
| 6,819,287 | B2 | 11/2004 | Sullivan et al. |
| 6,839,038 | B2 | 1/2005 | Weinstein |
| 6,859,176 | B2 | 2/2005 | Choi |
| 6,859,182 | B2 | 2/2005 | Horii |
| 6,876,280 | B2 | 4/2005 | Nakano |
| 6,876,836 | B2 | 4/2005 | Lin et al. |
| 6,888,504 | B2 | 5/2005 | Chiang et al. |
| 6,888,893 | B2 | 5/2005 | Li et al. |
| 6,892,230 | B1 | 5/2005 | Gu et al. |
| 6,903,686 | B2 | 6/2005 | Vance et al. |
| 6,906,678 | B2 | 6/2005 | Chen |
| 6,910,068 | B2 | 6/2005 | Zintel et al. |
| 6,914,581 | B1 | 7/2005 | Popek |
| 6,924,768 | B2 | 8/2005 | Wu et al. |
| 6,931,429 | B2 | 8/2005 | Gouge et al. |
| 6,941,143 | B2 | 9/2005 | Mathur |
| 6,943,749 | B2 | 9/2005 | Paun |
| 6,950,019 | B2 | 9/2005 | Bellone et al. |
| 6,950,069 | B2 | 9/2005 | Gaucher et al. |
| 6,961,028 | B2 | 11/2005 | Joy et al. |
| 6,965,353 | B2 | 11/2005 | Shirosaka et al. |
| 6,973,622 | B1 | 12/2005 | Rappaport et al. |
| 6,975,834 | B1 | 12/2005 | Forster |
| 6,980,782 | B1 | 12/2005 | Braun et al. |
| 7,023,909 | B1 | 4/2006 | Adams et al. |
| 7,034,769 | B2 | 4/2006 | Surducan et al. |
| 7,034,770 | B2 | 4/2006 | Yang et al. |
| 7,043,277 | B1 | 5/2006 | Pfister |
| 7,050,809 | B2 | 5/2006 | Lim |
| 7,053,844 | B2 | 5/2006 | Gaucher et al. |
| 7,064,717 | B2 | 6/2006 | Kaluzni et al. |
| 7,085,814 | B1 | 8/2006 | Gandhi et al. |
| 7,088,299 | B2 | 8/2006 | Siegler et al. |
| 7,089,307 | B2 | 8/2006 | Zintel et al. |
| 7,130,895 | B2 | 10/2006 | Zintel et al. |
| 7,171,475 | B2 | 1/2007 | Weisman et al. |
| 7,277,063 | B2 | 10/2007 | Shirosaka et al. |
| 7,312,762 | B2 | 12/2007 | Puente Ballarda et al. |
| 7,319,432 | B2 | 1/2008 | Andersson |
| 2001/0046848 | A1 * | 11/2001 | Kenkel .................... 455/277.1 |
| 2002/0031130 | A1 | 3/2002 | Tsuchiya et al. |
| 2002/0047800 | A1 | 4/2002 | Proctor, Jr. et al. |
| 2002/0080767 | A1 | 6/2002 | Lee |
| 2002/0084942 | A1 | 7/2002 | Tsai et al. |
| 2002/0101377 | A1 | 8/2002 | Crawford |
| 2002/0105471 | A1 | 8/2002 | Kojima et al. |
| 2002/0112058 | A1 | 8/2002 | Weisman et al. |
| 2002/0158798 | A1 | 10/2002 | Chiang et al. |
| 2002/0170064 | A1 | 11/2002 | Monroe et al. |
| 2003/0026240 | A1 | 2/2003 | Eyuboglu et al. |
| 2003/0030588 | A1 | 2/2003 | Kalis et al. |
| 2003/0063591 | A1 | 4/2003 | Leung et al. |
| 2003/0122714 | A1 | 7/2003 | Wannagot et al. |
| 2003/0169330 | A1 | 9/2003 | Ben-Shachar et al. |
| 2003/0184490 | A1 | 10/2003 | Raiman et al. |
| 2003/0189514 | A1 | 10/2003 | Miyano et al. |
| 2003/0189521 | A1 | 10/2003 | Yamamoto et al. |
| 2003/0189523 | A1 | 10/2003 | Ojantakanen et al. |
| 2003/0210207 | A1 | 11/2003 | Suh et al. |
| 2003/0227414 | A1 | 12/2003 | Saliga et al. |
| 2004/0014432 | A1 | 1/2004 | Boyle |
| 2004/0017310 | A1 | 1/2004 | Vargas-Hurlston et al. |
| 2004/0017860 | A1 | 1/2004 | Liu |

| | | | |
|---|---|---|---|
| 2004/0027291 A1 | 2/2004 | Zhang et al. |
| 2004/0027304 A1 | 2/2004 | Chiang et al. |
| 2004/0032378 A1 | 2/2004 | Volman et al. |
| 2004/0036651 A1 | 2/2004 | Toda |
| 2004/0036654 A1 | 2/2004 | Hsieh |
| 2004/0041732 A1 | 3/2004 | Aikawa et al. |
| 2004/0048593 A1 | 3/2004 | Sano |
| 2004/0058690 A1 | 3/2004 | Ratzel et al. |
| 2004/0061653 A1 | 4/2004 | Webb et al. |
| 2004/0070543 A1 | 4/2004 | Masaki |
| 2004/0080455 A1 | 4/2004 | Lee |
| 2004/0095278 A1 | 5/2004 | Kanemoto et al. |
| 2004/0114535 A1 | 6/2004 | Hoffmann et al. |
| 2004/0125777 A1 | 7/2004 | Doyle et al. |
| 2004/0145528 A1 | 7/2004 | Mukai et al. |
| 2004/0160376 A1 | 8/2004 | Hornsby et al. |
| 2004/0190477 A1 | 9/2004 | Olson et al. |
| 2004/0203347 A1 | 10/2004 | Nguyen |
| 2004/0260800 A1 | 12/2004 | Gu et al. |
| 2005/0022210 A1 | 1/2005 | Zintel et al. |
| 2005/0041739 A1 | 2/2005 | Li et al. |
| 2005/0042988 A1 | 2/2005 | Hoek et al. |
| 2005/0048934 A1 | 3/2005 | Rawnick et al. |
| 2005/0074018 A1 | 4/2005 | Zintel et al. |
| 2005/0097503 A1 | 5/2005 | Zintel et al. |
| 2005/0128983 A1 | 6/2005 | Kim et al. |
| 2005/0135480 A1 | 6/2005 | Li et al. |
| 2005/0138137 A1 | 6/2005 | Encarnacion et al. |
| 2005/0138193 A1 | 6/2005 | Encarnacion et al. |
| 2005/0146475 A1 | 7/2005 | Bettner et al. |
| 2005/0180381 A1 | 8/2005 | Retzer et al. |
| 2005/0188193 A1 | 8/2005 | Kuehnel et al. |
| 2005/0240665 A1 | 10/2005 | Gu et al. |
| 2005/0267935 A1 | 12/2005 | Gandhi et al. |
| 2006/0094371 A1 | 5/2006 | Nguyen |
| 2006/0098607 A1 | 5/2006 | Zeng et al. |
| 2006/0123124 A1 | 6/2006 | Weisman et al. |
| 2006/0123125 A1 | 6/2006 | Weisman et al. |
| 2006/0123455 A1 | 6/2006 | Pai et al. |
| 2006/0168159 A1 | 7/2006 | Weisman et al. |
| 2006/0184660 A1 | 8/2006 | Rao et al. |
| 2006/0184661 A1 | 8/2006 | Weisman et al. |
| 2006/0184693 A1 | 8/2006 | Rao et al. |
| 2006/0224690 A1 | 10/2006 | Falkenburg et al. |
| 2006/0225107 A1 | 10/2006 | Seetharaman et al. |
| 2006/0227761 A1 | 10/2006 | Scott, III et al. |
| 2006/0239369 A1 | 10/2006 | Lee |
| 2006/0262015 A1 | 11/2006 | Thornell-Pers et al. |
| 2006/0291434 A1 | 12/2006 | Gu et al. |
| 2007/0027622 A1 | 2/2007 | Cleron et al. |
| 2007/0135167 A1 | 6/2007 | Liu |

FOREIGN PATENT DOCUMENTS

| | | |
|---|---|---|
| EP | 0 534 612 | 3/1993 |
| EP | 0756381 A2 | 1/1997 |
| EP | 1152542 A1 | 11/2001 |
| EP | 1 376 920 | 6/2002 |
| EP | 1 315 311 | 5/2003 |
| EP | 1 450 521 | 8/2004 |
| EP | 1 608 108 | 12/2005 |
| JP | 03038933 | 2/1991 |
| JP | 2008/088633 | 2/1996 |
| JP | 2001/057560 | 2/2002 |
| JP | 2005/354249 | 12/2005 |
| JP | 2006/060408 | 3/2006 |
| WO | WO 90/04893 | 5/1990 |
| WO | WO 02/25967 | 3/2002 |
| WO | WO 03/079484 | 9/2003 |

OTHER PUBLICATIONS

"Authorizations of spread and other wideband emissions not presently provided for in the FCC Rules and Regulations," Before the Federal Communication, FCC 81-289, 87 F.C.C.2d 876, Gen Docket No. 81-413, Jun. 30, 1981.

RL Miller, "4.3 Project X—A True Secrecy System for Speech," Engineering and Science in the Bell System, A History of Engineering and Science in the Bell System National Service in War and Peace (1925-1975), pp. 296-317, 1978, Bell Telephone Laboratories, Inc.

Chang, Robert W., "Synthesis of Band-Limited Orthogonal Signals for Multichannel Data Transmission," The Bell System Technical Journal, Dec. 1966, pp. 1775-1796.

Cimini, Jr., Leonard J, "Analysis and Simulation of a Digital Mobile Channel Using Orthogonal Frequency Division Multiplexing," IEEE Transactions on Communications, vol. Com-33, No. 7, Jul. 1985, pp. 665-675.

Saltzberg, Burton R., "Performance of an Efficient Parallel Data Transmission System," IEEE Transactions on Communication Technology, vol. Com-15, No. 6, Dec. 1967, pp. 805-811.

Weinstein, S. B., et al., "Data Transmission by Frequency-Division Multiplexing Using the Discrete Fourier Transform," IEEE Transactions on Communication Technology, vol. Com-19, No. 5, Oct. 1971, pp. 628-634.

Moose, Paul H., "Differential Modulation and Demodulation of Multi-Frequency Digital Communications Signals," 1990 IEEE,CH2831-6/90/0000-0273.

Casas, Eduardo F., et al., "OFDM for Data Communication Over Mobile Radio FM Channels-Part I: Analysis and Experimental Results," IEEE Transactions on Communications, vol. 39, No. 5, May 1991, pp. 783-793.

Casas, Eduardo F., et al., "OFDM for Data Communication over Mobile Radio FM Channels; Part II: Performance Improvement," Department of Electrical Engineering, University of British Columbia.

Chang, Robert W., et al., "A Theoretical Study of Performance of an Orthogonal Multiplexing Data Transmission Scheme," IEEE Transactions on Communication Technology, vol. Com-16, No. 4, Aug. 1968, pp. 529-540.

Gledhill, J. J., et al., "The Transmission of Digital Television in the UHF Band Using Orthogonal Frequency Division Multiplexing," Sixth International Conference on Digital Processing of Signals in Communications, Sep. 2-6, 1991, pp. 175-180.

Alard, M., et al., "Principles of Modulation and Channel Coding for Digital Broadcasting for Mobile Receivers," 8301 EBU Review Technical, Aug. 1987, No. 224, Brussels, Belgium.

Berenguer, Inaki, et al., "Adaptive MIMO Antenna Selection," Nov. 2003.

Gaur, Sudhanshu, et al., "Transmit/Receive Antenna Selection for MIMO Systems to Improve Error Performance of Linear Receivers," School of ECE, Georgia Institute of Technology, Apr. 4, 2005.

Sadek, Mirette, et al., "Active Antenna Selection in Multiuser MIMO Communications," IEEE Transactions on Signal Processing, vol. 55, No. 4, Apr. 2007, pp. 1498-1510.

Molisch, Andreas F., et al., "MIMO Systems with Antenna Selection-an Overview," Draft, Dec. 31, 2003.

Ken Tang, et al., "MAC Layer Broadcast Support in 802.11 Wireless Networks," Computer Science Department, University of California, Los Angeles, 2000 IEEE, pp. 544-548.

Ken Tang, et al., "MAC Reliable Broadcast in Ad Hoc Networks," Computer Science Department, University of California, Los Angeles, 2001 IEEE, pp. 1008-1013.

Vincent D. Park, et al., "A Performance Comparison of the Temporally-Ordered Routing Algorithm and Ideal Link-State Routing," IEEE, Jul. 1998, pp. 592-598.

Ian F. Akyildiz, et al., "A Virtual Topology Based Routing Protocol for Multihop Dynamic Wireless Networks," Broadband and Wireless Networking Lab, School of Electrical and Computer Engineering, Georgia Institute of Technology.

Dell Inc., "How Much Broadcast and Multicast Traffic Should I Allow in My Network," PowerConnect Application Note #5, Nov. 2003.

Toskala, Antti, "Enhancement of Broadcast and Introduction of Multicast Capabilities in RAN," Nokia Networks, Palm Springs, California, Mar. 13-16, 2001.

Microsoft Corporation, "IEEE 802.11 Networks and Windows XP," Windows Hardware Developer Central, Dec. 4, 2001.

Festag, Andreas, "What is MOMBASA?" Telecommunication Networks Group (TKN), Technical University of Berlin, Mar. 7, 2002.

Hewlett Packard, "HP ProCurve Networking: Enterprise Wireless LAN Networking and Mobility Solutions," 2003.

Dutta, Ashutosh et al., "MarconiNet Supporting Streaming Media Over Localized Wireless Multicast," Proc. of the 2d Int'l Workshop on Mobile Commerce, 2002.

Dunkels, Adam et al., "Making TCP/IP Viable for Wireless Sensor Networks," Proc. of the 1st Euro. Workshop on Wireless Sensor Networks, Berlin, Jan. 2004.

Dunkels, Adam et al., "Connecting Wireless Sensornets with TCP/IP Networks," Proc. of the 2d Int'l Conf. on Wired Networks, Frankfurt, Feb. 2004.

Cisco Systems, "Cisco Aironet Access Point Software Configuration Guide: Configuring Filters and Quality of Service," Aug. 2003.

Hirayama, Koji et al., "Next-Generation Mobile-Access IP Network," Hitachi Review vol. 49, No. 4, 2000.

Pat Calhoun et al., "802.11r strengthens wireless voice," Technology Update, Network World, Aug. 22, 2005, http://www.networkworld.com/news/tech/2005/082208techupdate.html.

Areg Alimian et al., "Analysis of Roaming Techniques," doc.:IEEE 802.11-04/0377r1, Submission, Mar. 2004.

Information Society Technologies Ultrawaves, "System Concept / Architecture Design and Communication Stack Requirement Document," Feb. 23, 2004.

Golmie, Nada, "Coexistence in Wireless Networks: Challenges and System-Level Solutions in the Unlicensed Bands," Cambridge University Press, 2006.

Mawa, Rakesh, "Power Control in 3G Systems," Hughes Systique Corporation, Jun. 28, 2006.

Wennstrom, Mattias et al., "Transmit Antenna Diversity in Ricean Fading MIMO Channels with Co-Channel Interference," 2001.

Steger, Christopher et al., "Performance of IEEE 802.11b Wireless LAN in an Emulated Mobile Channel," 2003.

Chang, Nicholas B. et al., "Optimal Channel Probing and Transmission Scheduling for Opportunistics Spectrum Access," Sep. 2007.

Chuang et al., A 2.4 GHz Polarization-diversity Planar Printed Dipole Antenna for WLAN and Wireless Communication Applications, Microwave Journal, vol. 45, No. 6, pp. 50-62 (Jun. 2002).

Frederick et al., Smart Antennas Based on Spatial Multiplexing of Local Elements (SMILE) for Mutual Coupling Reduction, IEEE Transactions of Antennas and Propogation, vol. 52., No. 1, pp. 106-114 (Jan. 2004).

W.E. Doherty, Jr. et al., The Pin Diode Circuit Designer's Handbook (1998).

Varnes et al., A Switched Radial Divider for an L-Band Mobile Satellite Antenna, European Microwave Conference (Oct. 1995), pp. 1037-1041.

English Translation of PCT Pub. No. W02004/051798 (as filed US National Stage U.S. Appl. No. 10/536,547).

Behdad et al., Slot Antenna Miniaturization Using Distributed Inductive Loading, Antenna and Propagation Society International Symposium, 2003 IEEE, vol. 1, pp. 308-311 (Jun. 2003).

Press Release, NETGEAR RangeMax(TM) Wireless Networking Solutions Incorporate Smart MIMO Technology To Eliminate Wireless Dead Spots and Take Consumers Farther, Ruckus Wireles Inc. (Mar. 7, 2005), available at http://ruckuswireless.com/press/releases/20050307.php.

Tsunekawa, Kouichi, "Diversity Antennas for Portable Telephones," 39th IEEE Vehicular Technology Conference, pp. 50-56, vol. I, Gateway to New Concepts in Vehicular Technology, May 1-3, 1989, San Francisco, CA.

Supplementary European Search Report for foreign application No. EP07755519 dated Mar. 11, 2009.

Ando et al., "Study of Dual-Polarized Omni-Directional Antennas for 5.2 GHz-Band 2×2 MIMO-OFDM Systems," Antennas and Propogation Society International Symposium, 2004, IEEE, pp. 1740-1743 vol. 2.

Bedell, Paul, "Wireless Crash Course," 2005, p. 84, The McGraw-Hill Companies, Inc., USA.

Petition Decision Denying Request to Order Additional Claims for U.S. Patent No. 7,193,562 (Control U.S. Appl. No. 95/001,078) mailed on Jul. 10, 2009.

Right of Appeal Notice for U.S. Patent No. 7,193,562 (Control U.S. Appl. No. 95/001,078) mailed on Jul. 10, 2009.

* cited by examiner

REDUCING STRAY CAPACITANCE IN ANTENNA ELEMENT SWITCHING

CROSS-REFERENCE TO RELATED APPLICATIONS

The present application claims the priority benefit of U.S. provisional patent application No. 60/795,919 filed Apr. 28, 2006 and entitled "Systems and Methods for Switching Antenna Elements."

The present application is also a continuation-in-part and claims the priority benefit of U.S. patent application Ser. No. 11/010,076 filed Dec. 9, 2004 now U.S. Pat. No. 7,292,198 and entitled "System and Method for an Omnidirectional Planar Antenna Apparatus with Selectable Elements" and is also a continuation-in-part and claims the priority benefit of U.S. patent application Ser. No. 11/041,145 filed Jan. 21, 2005 now U.S. Pat. No. 7,362,280 and entitled "System and Method for a Minimized Antenna Apparatus with Selectable Elements." U.S. patent application Ser. No. 11/010,076 and 11/041,145 both claim the priority benefit of U.S. provisional patent application No. 60/602,711 filed Aug. 18, 2004 and entitled "Planar Antenna Apparatus for Isotropic Coverage and QoS Optimization in Wireless Networks" and U.S. provisional patent application No. 60/603,157 filed Aug. 18, 2004 and entitled "Software for Controlling a Planar Antenna Apparatus for Isotropic Coverage and QoS Optimization in Wireless Networks."

The present application is also related to U.S. patent application Ser. No. 11/646,136 filed Dec. 26, 2006 and entitled "Antennas with Polarization Diversity."

The disclosure of each of the aforementioned applications is incorporated herein by reference.

BACKGROUND

1. Field of the Invention

The present invention generally relates to wireless communications networks. More particularly, the present invention relates to the switching of selectable antenna elements utilizing p-type, intrinsic, n-type (PIN) diodes thereby reducing or eliminating certain radio frequency (RF) resonance functions of the antenna element.

2. Description of the Related Art

Wireless communications systems are burdened with an ever-increasing demand for higher data throughput. These same systems are concurrently driven by the need to reduce interference that can disrupt data communications. For example, in an Institute of Electrical and Electronics Engineers, Inc. (IEEE) 802.11 network, an access point may communicate with one or more remote receiving nodes over a wireless link. The wireless link may be susceptible to interference from other access points and stations (nodes), other radio transmitting devices, changes or disturbances in the wireless link environment between the access point and the remote receiving node, and so forth. In some instances, the interference may be of such significance as to force communications across the wireless link at a lower data rate or to completely disrupt the wireless link all together.

As disclosed in, for example, U.S. patent application Ser. No. 11/010,076 and 11/041,145, Ruckus Wireless, Inc. of Sunnyvale, Calif., has utilized a series of antenna elements to produce a substantially omnidirectional radiation pattern. This pattern may be generated when two or more antenna elements are selectively coupled to an RF signal source. In some instances, this selective coupling occurs through the use of one or more PIN diodes.

Stray capacitance is an undesirable capacitance existing between two conductors. Stray capacitance may be found in the context of a PIN diode due to the semi-conducting nature of the same. Stray or "parasitic" capacitance also tends to occur between parallel traces on a printed circuit board (PCB) or between traces planes on opposite sides of a PCB. The occurrence and effects of stray capacitance are often overlooked during modeling and may lead to serious performance issues after a PCB and its constituent elements (e.g., radio equipment and antenna elements) are constructed and assembled. Stray capacitance may result in greater noise, reduced frequency response, and even system instability.

The stray capacitance of PIN diodes in an antenna array, especially in a series of PIN diodes, may hinder the operation of the antenna array and/or the components thereon. While stray capacitance may never be entirely eliminated, stray capacitance may, generally, be controlled. Stray capacitance is, therefore, a performance attribute that may drive the cost of a PIN diode. At a given operating frequency, a PIN diode with relatively low stray capacitance is typically more expensive than a PIN diode with higher stray capacitance.

In addition to expense, certain techniques for eliminating stray capacitance may require additional components to be located on or coupled to the PCB. These additional components may increase difficulties related to manufacturing and design with respect to configuring various elements in a finite space. These additional components, too, may increase the cost of manufacture.

There is a need in the art to reduce stray capacitance with respect to selective antenna elements utilizing PIN diodes. Reduction of stray capacitance should occur without significantly increasing manufacture costs. Reduction of stray capacitance should also avoid negatively affecting overall antenna design. Any reduction of stray capacitance should not interfere with the selective coupling and switching of an antenna element utilizing a PIN diode.

SUMMARY OF THE INVENTION

One exemplary embodiment is for an antenna array that includes an antenna element configured to receive an RF signal and a PIN diode coupled to the antenna element. Biasing the PIN diode influences the received RF signal. In the case of the PIN diode being forward biased, the received RF signal is cancelled at a stub coupled to the PIN diode by reflecting the RF signal out-of-phase within the stub. Cancellation of the RF signal may reduce stray capacitance of the PIN diode. An inductor may be further coupled to the stub thereby drawing the RF signal to the stub via the forward biased PIN diode.

The antenna element may be a part of a series of antenna elements selectively coupled to an RF source by a PIN diode associated with each of the antenna elements. Selectively coupling one or more antenna elements in the series to the RF source may generate one or more directional radiation patterns. These patterns are substantially in the plane of the antenna elements. A combined radiation pattern resulting from the selective coupling of the one or more antenna elements in the series may be substantially omnidirectional.

Another exemplary embodiment is for a method for switching antenna elements within an array. An RF signal is received at an antenna element. A PIN diode coupled to the antenna element is thereby influencing the received RF signal. In the instance that the PIN diode is forward biased, the received RF signal may be cancelled at a stub coupled to the PIN diode. Cancellation may occur by reflecting the RF signal out-of-phase within the stub. By canceling the RF signal, stray capacitance of the PIN diode may be reduced.

The antenna element may be a part of a series of antenna elements selectively coupled to an RF source by a PIN diode associated with each of the antenna elements. The method may further include selectively coupling one or more antenna elements in the series to the RF source and generating one or more directional radiation patterns. These patterns may be substantially in the plane of the elements. A combined radiation pattern resulting from the selective coupling of the elements in the series may generate a substantially omnidirectional radiation pattern.

DETAILED DESCRIPTION

The disclosed antenna elements and antenna arrays utilizing such elements may be configured to receive an RF signal. A biased semiconductor device such as a PIN diode may be coupled to the antenna element receiving the RF signal. When forward biased or "on," the PIN diode may behave as a variable resistor. Alternatively, the PIN diode may behave as a parallel plate capacitor when the diode is zero or reverse biased ("off").

Subject to the bias of the aforementioned PIN diode, the RF signal may be reflected (e.g., via a forward bias) out-of-phase within a stub to cancel or reduce the received RF signal. By canceling or reducing the RF signal, the signal may no longer propagate through the antenna element thereby functionally turning the element "off."

PIN diodes may be used in series to function as "RF switches" for an antenna with multiple antenna elements. An antenna array may include any number of antenna elements that are controlled individually, collectively, or as a part of groups of elements via a PIN diode (or series of PIN diodes). Antenna elements may be turned "on" or "off" by coupling each of the one or more antenna elements of the antenna array to a separate PIN diode. In the context of a WiFi communications application (e.g., an application used to communicate over an 802.11x network), one or more antenna elements of an antenna array may be controlled with PIN diodes thereby increasing, reducing or eliminating the function of the antenna array.

Figure 1:
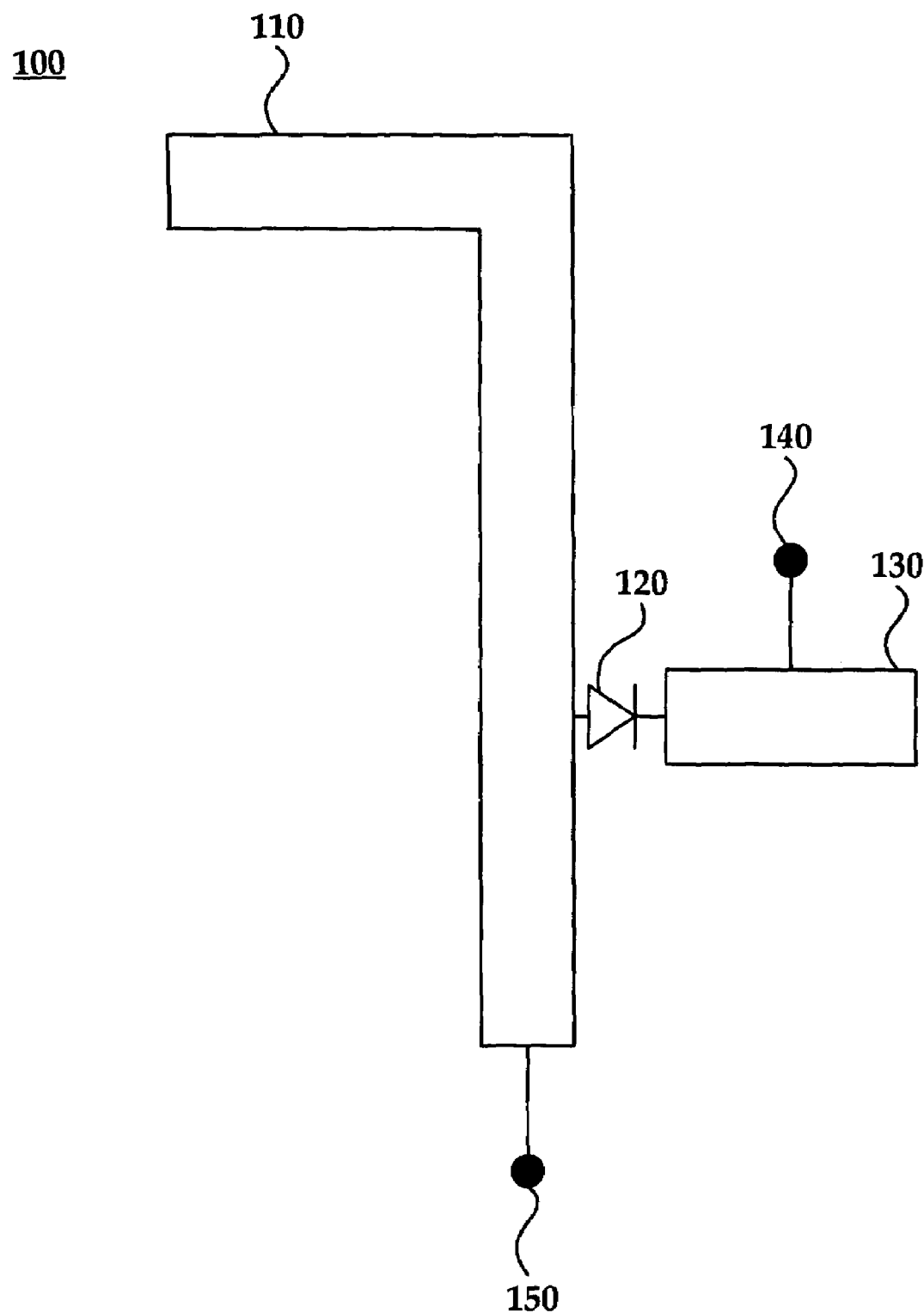
FIG. 1 is an illustration of a selectable antenna element.

FIG. 1 is an illustration of a selectable antenna element 100 according to one exemplary embodiment of the present invention. The selectable antenna element 100 disclosed in FIG. 1 includes antenna element 110, PIN diode 120, stub 130, and inductor 140. Antenna element 110 may be communicatively coupled to an RF link 150, which may be a part of a WiFi communications network. RF link 150 may also be representative of any other path for RF signals including one to other antenna elements 110, a receiver, or a transmitter.

Antenna element 110 may be configured to transmit and/or receive RF signals received over the RF link 150. Antenna element 110 may provide isotropic gain and/or a directional radiation pattern substantially in the plane of the element 110. Antenna element 110 may be electrically selected (e.g., switched "on" or "off") so that an antenna array incorporating one or more antenna elements 110 may form a configurable radiation pattern. For example, if all antenna elements 110 in a particular antenna array are switched "on," the antenna array may form an omnidirectional radiation pattern. Alternatively, if two or more antenna elements 110 in an antenna array are switched "on," the antenna array may form a substantially omnidirectional radiation pattern.

An antenna array utilizing a particular configuration of selectable antenna elements 100 (or a device utilizing an array such as a base station) may minimize interference over the RF link 150 with respect to, for example, a remote receiving device. If the RF link 150 experiences interference due to other radio transmitting devices or changes or disturbances in the RF link 150, a different configuration of antenna elements 110 may be selected. This change in selection will result in a new radiation pattern and may minimize the interference. A selected configuration of antenna elements 110 that corresponds to a maximum gain between the array and the remote receiving device may also be implemented. Alternatively, a configuration of antenna elements 110 corresponding to less than maximum gain but corresponding to reduced interference over the RF link 150 may also be selected.

A directional radiation pattern substantially in the plane of the antenna elements is emitted by each antenna element 110. The antenna element 110 may be mounted on or embedded in a planar substrate such as a flame resistant 4 (FR-4) PCB. Antenna element 110 may be a part of an antenna array that may be integrated into or conformally mounted to a housing of a wireless device.

Antenna element 110 may be like those disclosed in U.S. patent application Ser. No. 11/010,076 for a "System and Method for an Omnidirectional Planar Antenna Apparatus with Selectable Elements"; U.S. patent application Ser. No. 11/041,145 for a "System and Method for a Minimized Antenna Apparatus with Selectable Elements"; or U.S. patent application Ser. No. 11/646,136 for "Antennas with Polarization Diversity." Likewise, the selectable antenna element 100 disclosed in the present application may be configured to operate in the context of the antenna systems disclosed in the aforementioned applications.

PIN diode 120, stub 130, and inductor 140 may be configured to operate as an RF switch to control the reception and/or transmission of RF signals from the antenna element 110 thereby operating as a selectable antenna element 100. PIN diode 120 may include a single-pole, single-throw switch to switch each antenna element either "on" or "off." This switching may occur by coupling or decoupling each antenna element 110 to a radio frequency feed port (not shown). A control signal or series of control signals (not shown) may be used to bias each PIN diode 120 in this regard. With the PIN diode 120 forward biased and conducting a DC current, the PIN diode 120 switch is "on," and the corresponding antenna element is selected. With the PIN diode 120 reverse biased, the PIN diode switch is "off."

In some embodiments, when the PIN diode 120 is reverse biased, the PIN diode 120 is "off" and electrically decouples the stub 130 (as well as the inductor 140) from the antenna element 110. As a result, RF signals may be allowed to propagate through the antenna element 110. If the PIN diode 120 is forward biased, the PIN diode 120 is activated (i.e., turned "on"), which electrically couples the stub 130 to the antenna element 110.

Stub 130 is a signal path (e.g., transmission line) of a predetermined length that may be used for impedance matching or to obtain a value of capacitance or inductance. Stub 130 takes on reactive properties as a function its electrical length. For example, stub 130 may be one quarter (¼) of the wavelength of the RF signal in length. The contextually appropriate length of stub 130 may be determined by utilizing a Smith Chart. In some embodiments, a ground plane may be located adjacent to stub 130.

If PIN diode 120 is forward biased, the PIN diode 120 is "active." The stub 130 may receive RF signals from the antenna element 110 via the activated PIN diode 120. The RF signals received from the antenna element 110 via PIN diode 120 are reflected out-of-phase with respect to the incoming RF signals within the stub 130. As a result, the RF signals are canceled thereby limiting or eliminating RF signal propagation through the antenna element 110.

Inductor 140 may be configured within selectable antenna element 100 to operate as an "RF choke." By operating as an "RF choke," the RF signal may be drawn through the activated PIN diode 120 and subsequently limited or eliminated by RF reflections within the stub 130. In one example, inductor 140 may be a chip inductor with a self resonance at the frequency of the RF signal thereby forming an open circuit within the stub 130.

By coupling PIN diode 120 to antenna element 110 and the stub 130, stray capacitance of the PIN diode 120 will not adversely affect intended functions of the antenna element 110. Moreover, multiple PIN diodes 120 that may each control separate antenna elements 110 within an antenna array (like in FIG. 2) may not generate appreciable stray capacitance in the aggregate and that might otherwise impair the function of the array. As a result, one or more antenna elements 110 of an antenna array may be independently controlled with PIN diodes 120 without having to implement costly low capacitance PIN diodes. Embodiments of the present invention may also avoid the need for additional components to effectuate reduced stray capacitance that might otherwise contribute to the overall size and manufacturing costs of an antenna array.

Figure 2:
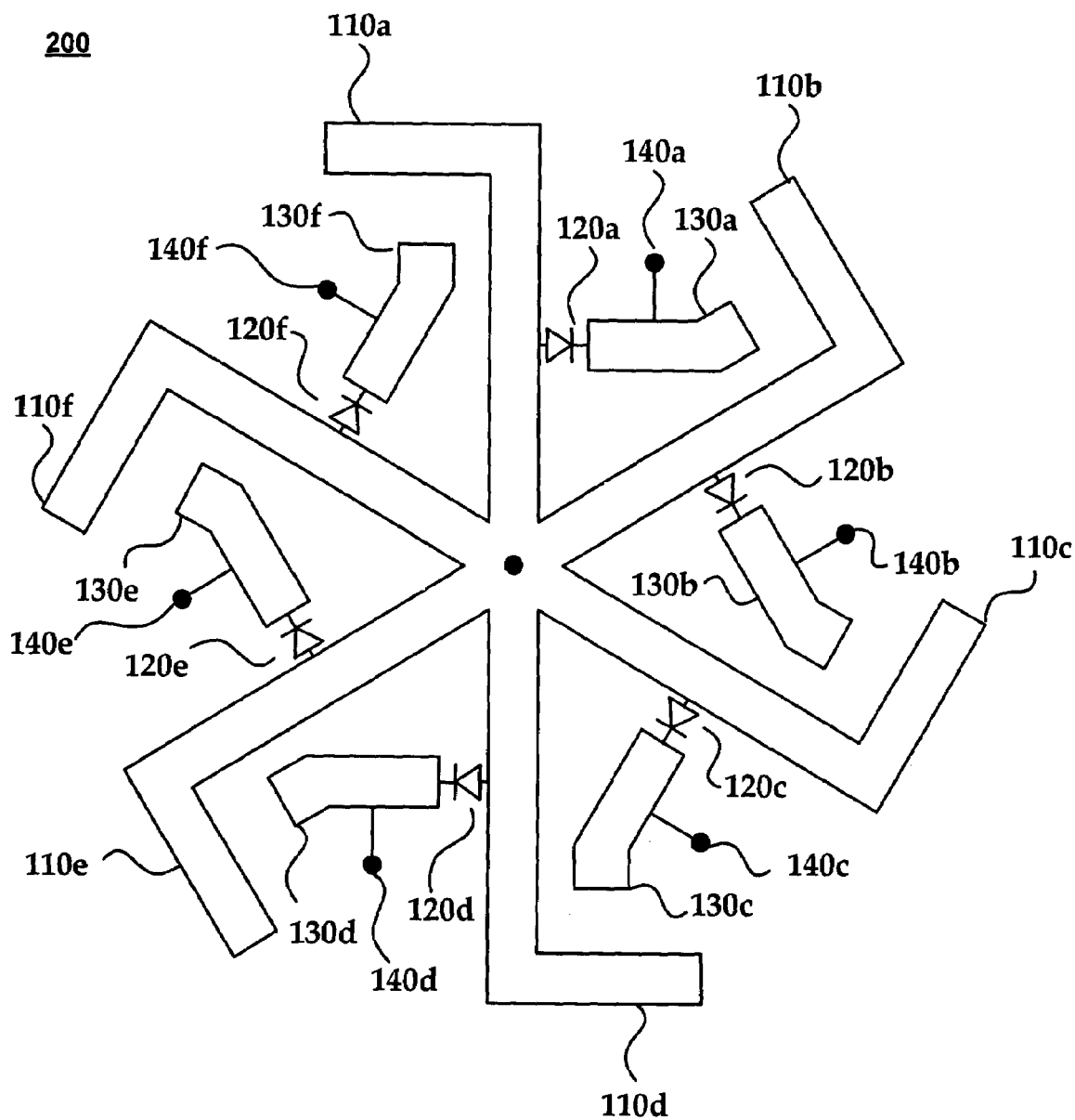
FIG. 2 is an illustration of an antenna array including selectable antenna elements.

FIG. 2 is an illustration of an antenna array 200 including selectable antenna elements according to an exemplary embodiment of the present invention. Antenna array 200, in some embodiments, may be configured and otherwise capable of transmitting and/or receiving RF signals between 2.4 and 5 GHz. Antenna array 200, as illustrated in FIG. 2, includes antenna elements 110a-f. Antenna elements 110a-110f are capable of being electrically selected. Through such selection, antenna elements 110a-110f may produce differing radiation patterns capable of receiving RF signals relative to the array 200. Although array 200 reflects five individual selectable antenna elements 110a-110f, the array 200 may include any number of elements.

Each antenna element 110a-110f is separately coupled to PIN diodes 120a-f. Stubs 130a-130f are coupled to PIN diodes 120a-f, respectively. Similarly, inductors 140a-f are coupled to stubs 130a-f, respectively. PIN diodes 120a-f, stubs 130a-f, and inductors 140a-f may be configured to function as RF switches for the respective antenna element 110a-f.

As discussed herein, when PIN diodes 120a-f are forward biased, RF signals within the stubs 130a-f may be reflected out-of-phase with the incoming RF signals. As a result, the RF signals within the antenna elements 110a-f may cease to function (i.e., the elements are turned "off"). Some of antenna elements 110a-f of the antenna array 200 may be turned "off" while others elements 110a-f are turned "on." In such an instance, one or more PIN diodes 120a-f are forward biased thereby canceling RF signals within the stubs 130a-f before the RF signals are propagated within the respective antenna element 110a-f. Simultaneously, other PIN diodes 120a-f may be reverse biased thereby allowing RF signals to propagate within the respective antenna elements 110a-f. By selectively applying a forward or reverse bias to the PIN diodes 120a-f, any number of antenna elements 110a-f may be active or inactive at any time. Further, by changing the state of the PIN diodes 120a-f, any number of antenna elements 110a-f can be turned "on" or "off" at any time.

Figure 3:
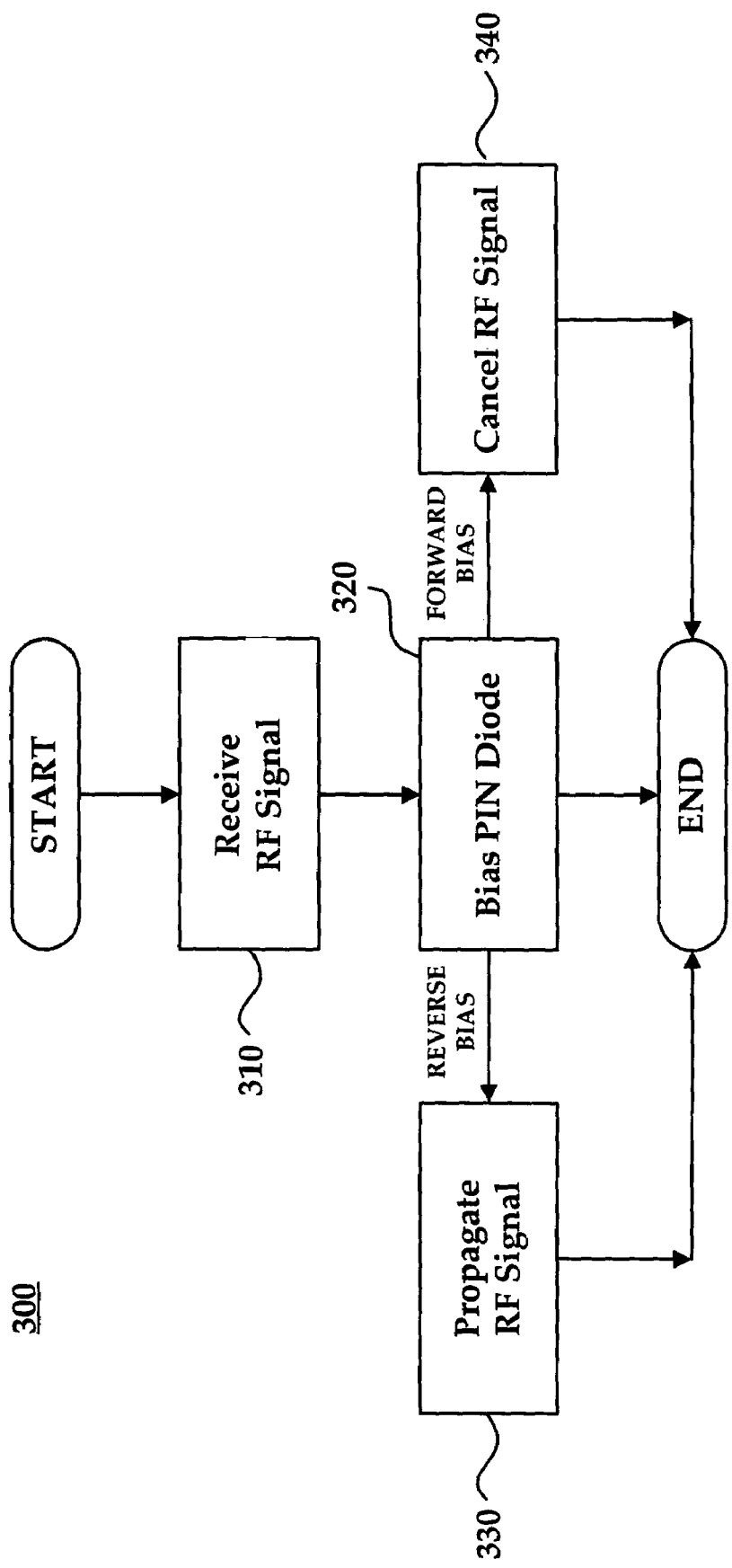
FIG. 3 illustrates an exemplary method for reducing stray capacitance in antenna element switching.

FIG. 3 illustrates an exemplary method 300 for reducing stray capacitance in antenna element switching in accordance with an exemplary embodiment of the present invention. In step 310, an RF signal is received. At step 320, the PIN diode is biased as may occur as a part of a selective coupling operation. If the PIN diode is reverse biased (i.e., turned "off"), then the RF signal is allowed to propagate through the antenna element in step 330. If, however, the PIN diode is forward biased (i.e., turned "on") then RF signal is cancelled (e.g., reduced or eliminated) as may occur through out-of-phase reflection within a stub. RF signals may be drawn into the stub via the forward biased PIN diode through the assistance of an inductor as previously described herein.

The embodiments discussed herein are illustrative. As these embodiments are described with reference to illustrations, various modifications or adaptations of the methods and or specific structures described may become apparent to those skilled in the art. All such modifications, adaptations, or variations that rely upon the teachings of the present disclosure and through which these teachings have advanced the art are considered to be within the spirit and scope of the present invention. Hence, these descriptions and drawings should not be considered in a limiting sense as it is understood that the present invention is in no way limited to only the embodiments illustrated.

What is claimed is:

1. An antenna array comprising:
    an antenna element configured to receive an RF signal;
    a PIN diode coupled to the antenna element, wherein biasing the PIN diode influences the received RF signal, wherein the PIN diode is forward biased and the received RF signal is cancelled at a stub coupled to the PIN diode; and
    an inductor coupled to the stub, wherein the stub biases the pin diode while maintaining energy within the stub.

2. The antenna array of claim 1, wherein the RF signal is cancelled by reflecting the RF signal out-of-phase within the stub.

3. The antenna array of claim 2, wherein the cancellation of the RF signal reduces stray capacitance of the PIN diode.

4. The antenna array of claim 1, wherein the inductor draws the RF signal to the stub via the forward biased PIN diode.

5. The antenna array of claim 4, wherein the inductor is a chip inductor with a self-resonance at the frequency of the RF signal.

6. The antenna array of claim 1, wherein the PIN diode is reverse biased and the received RF signal is allowed to propagate at the antenna element.

7. The antenna array of claim 1, wherein the stub is one-quarter of the wavelength of the RF signal in length.

8. The antenna array of claim 1, wherein the antenna element is configured to be selectively coupled to an RF source by the PIN diode, the PIN diode being associated with the antenna element.

9. The antenna array of claim 8, wherein the antenna element is a part of a series of antenna elements that may each be selectively coupled to the RF source by a PIN diode associated with each of the series of antenna elements.

10. The antenna array of claim 9, wherein selectively coupling one or more antenna elements in the series of antenna elements to the RF source generates one or more directional radiation pattern substantially in the plane of the one or more antenna elements.

11. The antenna array of claim 10, wherein a combined radiation pattern resulting from the selective coupling of the one or more antenna elements in the series of antenna elements is substantially omnidirectional.

12. An antenna array comprising:
   an antenna element configured to receive an RF signal;
   a PIN diode coupled to the antenna element, wherein forward biasing of the PIN diode cancels the received RF signal at a stub coupled to the PIN diode by reflecting the RF signal out-of-phase within the stub, the cancellation of the RF signal reducing stray capacitance of the PIN diode; and
   a chip inductor coupled to the stub with a self-resonance at the frequency of the RF signal, the inductor configured to draw the RF signal to the stub via the forward biased PIN diode.

13. The antenna array of claim 12, wherein the antenna element is a part of a series of antenna elements that may be selectively coupled to an RF source by an associated PIN diode and selectively coupling one or more antenna elements in the series of antenna elements to the RF source generates one or more directional radiation patterns substantially in the plane of the one or more antenna elements.

14. The antenna array of claim 13, wherein a combined radiation pattern that results from the selective coupling of the one or more antenna elements in the series of antenna elements is substantially omnidirectional.

15. A method for reducing stray capacitance in antenna element switching, comprising:
   receiving an RF signal within an antenna element; and
   biasing a PIN diode coupled to the antenna element, wherein biasing the PIN diode influences the received RF signal, wherein the PIN diode is forward biased and the received RF signal is cancelled at a stub coupled to the PIN diode, the PIN diode biased with the stub while maintaining energy within the stub, wherein an inductor is connected to the stub.

16. The method of claim 15, wherein the PIN diode is forward biased and the received RF signal is cancelled at the stub coupled to the PIN diode by reflecting the RF signal out-of-phase within the stub.

17. The method of 16, wherein the cancellation of the RF signal reduces stray capacitance of the PIN diode.

18. The method of claim 17, wherein the antenna element is a part of a series of antenna elements that may be selectively coupled to an RF source by a PIN diode individually associated with each of the series of antenna elements.

19. The method of claim 18, further comprising:
   selectively coupling one or more antenna elements in the series of antenna elements to the RF source; and
   generating a directional radiation pattern substantially in the plane of the one or more antenna elements, wherein a combined radiation pattern resulting from the selective coupling of the one or more antenna elements in the series of antenna elements generates a substantially omnidirectional radiation pattern.

* * * * *